TEMPERATURE STABILIZED TRANSISTOR AMPLIFIER
Filed June 10, 1966
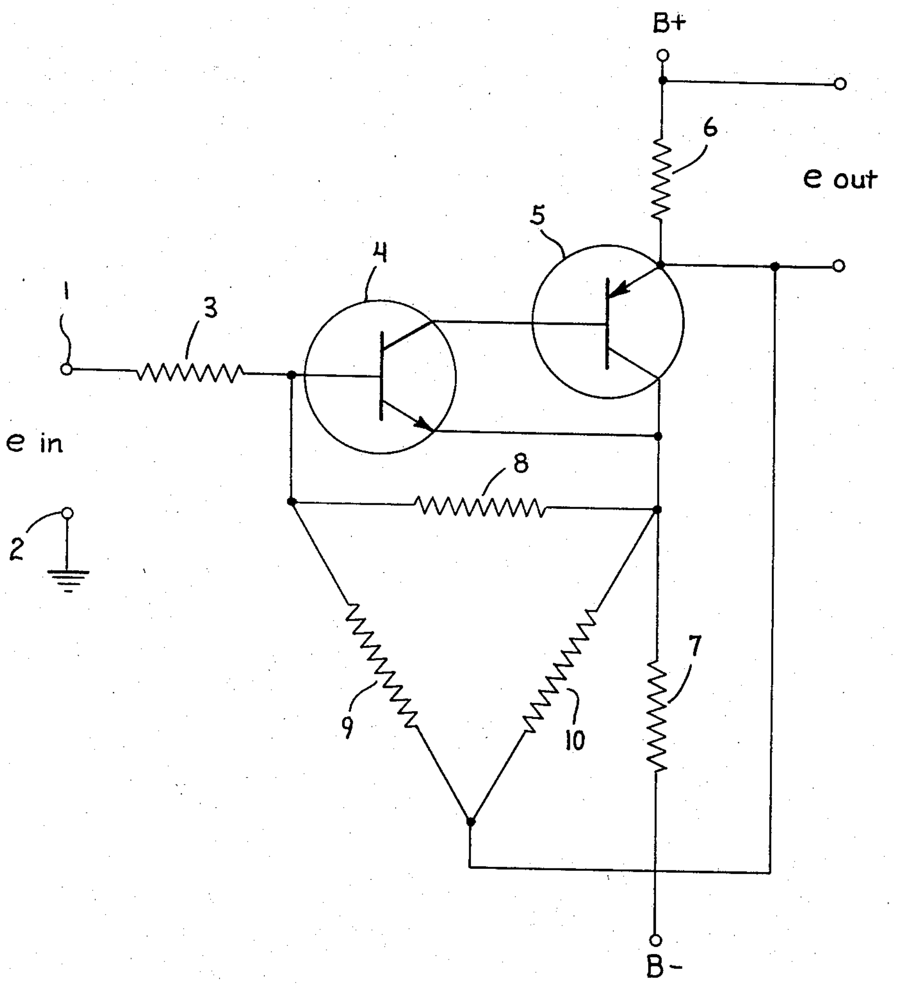
INVENTOR
VAN B. CONES
BY H. H. Losche
Attorney United States Patent Office 3,373,369
Patented Mar. 12, 1968

3,373,369
TEMPERATURE STABILIZED TRANSISTOR AMPLIFIER

Van B. Cones, Indianapolis, Ind., assignor to the United States of America as represented by the Secretary of the Navy Filed June 10, 1966, Ser. No. 556,786
2 Claims. (Cl. 330—23)

The invention described herein may be manufactured and used by or for the Government of the United States of America for governmental purposes without the payment of any royalties thereon or therefor.

This invention relates to temperature stable amplifiers, and more particularly to a pair of temperature stable amplifiers which have a difference in gain that remains constant over a wide temperature range. The invention may be applied where a slight drift in gain over a wide temperature range is permissible, and where the difference in gain between two of the amplifiers must remain constant.

Prior to this invention this function was performed by circuitry involving differential amplifiers which necessitated the use of a greater number of components. Consequently, prior circuits were of a lower reliability. More important, however, is the fact that no comparatively simple amplifier circuit is known to exist which has the temperature stability of the present invention.

The concept of temperature stabilization which is used in the invention is conventional; that is, a negative feedback arrangement. It is the means of coupling the feedback which is unique, however, and it is this means which provides the stability. A very small portion of the output voltage, which is 180° out of phase with the input, is fed back to the input to provide instantaneous compensation for temperature drift. It is a general object of this invention, therefore, to provide an amplifier which has a very stable gain over a wide temperature range and furthermore an amplifier whose gain remains constant over a wide temperature range when referenced to the gain of an identical amplifier.

Other objects, advantages, uses, and novel features of the invention will become apparent from the following detailed description of the invention when considered in conjunction with the accompanying drawing in which the single figure of drawing is a schematic representation of the invention showing one embodiment.

Specifically, the figure shows input terminals 1 and 2 across which an input may be applied. Terminal 1 is coupled through a series resistor 3 to the base of an NPN transistor 4. Transistor 4 is connected in a tandem arrangement to a PNP transistor 5 with the collector and emitter of transistor 4 connected to the base and collector respectively of transistor 5. The emitter of transistor 5 serves as the output point of the circuit and it is connected to a load resistor 6. The opposite end of resistor 6 is connected to a source of positive potential. The collector of transistor 5 is coupled through a dropping resistor 7 to a point of negative potential. A feedback network is provided from the circuit output to the base of transistor 4. This feedback path is comprised of resistors 8, 9, and 10, where resistor 8 is coupled across the base emitter junction of transistor 4, and where the series combination of identical resistors 9 and 10 is connected in parallel with resistor 8. The junction of resistors 9 and 10 is then coupled to the circuit output, thereby providing feedback of the output signal to the electrical center of resistor 8. This unique method of feedback provides the necessary temperature stabilization.

In choosing values for the three resistors associated with the feedback network, resistor 8 should be chosen for input impedance considerations and resistors 9 and 10 should then be chosen for having high values with respect to resistor 8. Representative values for resistor 8 would be in the range of 10K ohms with resistors 9 and 10 then being in the range of 1 megohm.

In the operation of the invention a signal is applied across terminals 1 and 2, dropped slightly by resistor 3, and applied to the base of transistor 4. Assuming the signal is positive, transistor 4 will conduct and draw current from the base of transistor 5 thereby causing it to conduct also. This will cause a greater current to flow through the load, consequently dropping the voltage at the emitter of transistor 5. The feedback signal is taken from this point in the circuit where the output goes negative as the input goes positive. Temperature stability is introduced by this feedback signal when a greater current flows through resistor 5, due to temperature variations, even though there is no change in signal at the input. This causes the voltage at the emitter of transistor 5 to decrease and through the feedback path the circuit is driven back to equilibrium.

The invention described above provides an amplifier which, due to its unique feedback means, has very good temperature stability and has a predictable gain-temperature characteristic, so that the difference in gain between two of these amplifiers, when compared over a wide ambient temperature range such as −55° C. to +125° C., will be negligible.

It will be understood that various changes in the details, which have been herein described and illustrated in order to explain the nature of the invention, may be made by those skilled in the art within the principle and scope of the invention and I desire to be limited only in the scope of the appended claims.

I claim:

1. An amplifying device having a very stable gain-temperature characteristic when plotted over a wide ambient temperature range, comprising:
   input terminal means coupled to an amplifying transistor means, said transistor means having a control electrode coupled to said input means and having first and second conducting electrodes, said first conducting electrode comprising the output point of the device and being coupled to a load resistor, the opposite end of said load resistor being coupled to a point of one potential, said second conducting electrode being coupled to a dropping resistor the other end of which is coupled to a point of the other potential; and
   a feedback network comprising first, second, and third resistors, said first resistor being coupled from said control electrode of said transistor means to said second conducting electrode thereof, said second and third resistors being coupled in series with one another and coupled in parallel with said first resistor, the junction formed by the series coupling of said first and second resistors being coupled to said first conducting electrode of said transistor means, wherein said second and third resistors are of substantially equal value and are of a very high resistance value with respect to said second resistor, and wherein said output point of said device produces a signal which is 180° out of phase with the signal at said input terminal means, thereby providing a negative feedback from said output through said feedbeck network to said input.

2. An amplifying device as described in claim 1 wherein:
   said transistor means is comprised of an NPN transistor and a PNP transistor coupled in tandem, said NPN transistor having as its base electrode said control electrode coupled to said input means, the collector of said NPN transistor being coupled to the base electrode of said PNP transistor, the emitter electrode of said PNP transistor comprises said first conducting electrode, and the emitter electrode of said NPN transistor being coupled to the collector electrode of said PNP transistor thereby forming a junction which comprises said second conducting electrode.

No references cited.

ROY LAKE, *Primary Examiner.*

L. DAHL, *Assistant Examiner.*